United States Patent
Dresti et al.

(10) Patent No.: US 7,193,661 B2
(45) Date of Patent: Mar. 20, 2007

(54) TWO WAY COMMUNICATION USING LIGHT LINKS

(75) Inventors: Mauro Dresti, West Covina, CA (US); Patrick H. Hayes, Mission Viejo, CA (US); Youping (Edward) Yun, Monterey Park, CA (US)

(73) Assignee: Universal Electronics Inc., Cypress, CA (US)

( * ) Notice: Subject to any disclaimer, the term of this patent is extended or adjusted under 35 U.S.C. 154(b) by 516 days.

(21) Appl. No.: 09/967,069

(22) Filed: Sep. 27, 2001

(65) Prior Publication Data

US 2005/0280743 A1    Dec. 22, 2005

(51) Int. Cl.
*H04N 5/44* (2006.01)

(52) U.S. Cl. ...................................... 348/734; 348/731

(58) Field of Classification Search ................ 348/734; 340/825.72, 825.69
See application file for complete search history.

(56) References Cited

U.S. PATENT DOCUMENTS

| | | | |
|---|---|---|---|
| 4,495,654 A | 1/1985 | Deiss | |
| 4,807,031 A | 2/1989 | Broughton et al. | |
| 4,959,810 A | 9/1990 | Darbee et al. | |
| 5,228,077 A | 7/1993 | Darbee | |
| 5,255,313 A | 10/1993 | Darbee | |
| 5,299,010 A | 3/1994 | Nakazawa et al. | |
| 5,410,326 A | 4/1995 | Goldstein | |
| 5,414,426 A | 5/1995 | O'Donnell et al. | |
| 5,481,256 A | 1/1996 | Darbee et al. | |
| 5,515,052 A | 5/1996 | Darbee | |
| 5,537,463 A | 7/1996 | Escobosa et al. | |
| 5,552,837 A * | 9/1996 | Mankovitz | 725/25 |
| 5,594,493 A | 1/1997 | Nemirofsky | |
| 5,629,868 A * | 5/1997 | Tessier et al. | 348/164 |
| 5,671,267 A | 9/1997 | August et al. | |
| 5,917,481 A | 6/1999 | Rzeszewski et al. | |
| 5,963,269 A * | 10/1999 | Beery | 348/570 |
| 6,130,726 A * | 10/2000 | Darbee et al. | 348/734 |
| 6,215,531 B1 | 4/2001 | Beery | |
| 6,262,780 B1 | 7/2001 | Ho et al. | |
| 6,278,499 B1 * | 8/2001 | Darbee et al. | 348/734 |
| 6,400,280 B1 | 6/2002 | Osakabe | |
| 6,407,779 B1 | 6/2002 | Herz | |

FOREIGN PATENT DOCUMENTS

JP        58153484        9/1983

OTHER PUBLICATIONS

U.S. Appl. No. 09/418,091, filed Oct. 14, 1999, Young et al.
U.S. Appl. No. 09/718,931, filed Nov. 21, 2000, Arling et al.

* cited by examiner

*Primary Examiner*—Trang U. Tran
(74) *Attorney, Agent, or Firm*—Gary R. Jarosik

(57) ABSTRACT

Two-way communications between a video system and a control device is disclosed. The communications links comprise visible light, IR light, or a combination of visible and IR light. The communications link provide a convenient route to capture data or lock system features or various combinations thereof.

3 Claims, 9 Drawing Sheets

SCAN TABLE ated herein by reference. The '426 patent discloses an entry
program for enabling a user to define a macro for selecting
TWO WAY COMMUNICATION USING LIGHT LINKS

FIELD OF THE INVENTION

The present invention relates to hand-held remote control modules, as well as consumer electronic devices. Specific exemplary embodiments discussed relate to hand-held remote controls and televisions connected to cable set-top boxes.

BACKGROUND OF THE INVENTION

The description of art in this section is not intended to constitute an admission that any patent, publication or other information referred to herein is "prior art" with respect to this invention, unless specifically designated as such.

While the present invention relates to hand-held control modules generally, it will be better understood within the discussion of exemplary embodiments directed toward universal remote controls. Universal remote controls typically offer a preprogrammed set of standardized keys for each device type supported. These provide for the common operational functions of the device but do not necessarily offer the full range of features available on the original manufacturer's remote.

U.S. patents and applications relevant to remote control technology include U.S. Pat. Nos. 5,515,052; 5,255,313; and U.S. patent application Ser. No. 09/418,091 filed Oct. 14, 1999, which are incorporated herein by reference. Pat. '052 discloses a universal remote control with function synthesis. The remote control comprises driver circuitry for communicating code signal generation sequences including a code generated command signal followed by a code setting signal; and memory for storing information therein. Pat. '313 discloses a universal remote control system having a signal generator to transmit signals which will cause specific functions to occur in specific controlled devices. patent application Ser. No. '091 discloses means and methods for operating a remote control.

Users of universal remote controls who need access to one or more functions not preprogrammed into the unit must then use a learning capability or a feature, such as a function synthesizer (e.g., the function synthesizer discussed in Pat. '052) to add the desired extra functions to their remotes. Other U.S. Patents related to remote control technology, and in particular, relating to learning technology include U.S. Pat. Nos. 4,959,810, 5,228,077, and 5,537,463 which are incorporated herein by reference.

Pat. '810 discloses means for transferring instructions and/or data to RAM wherein the instructions and/or data is transferred from a source external to the RAM. Pat. '077 discloses a remotely upgradable universal remote control. Pat. '463 discloses means in the remote control for picking up an electromagnetic signal from an electro-magnetic signal source and storing output signal data in memory. The output signal data stored in memory may correspond to control function data which may be transmitted to a device to be controlled.

U.S. Pat. No. 5,481,256, issued Jan. 2, 1996, is incorporated herein by reference. The '256 patent discloses circuitry for coupling a SCAN key to a microprocessor and a channel scan program. A channel scan of channels is initiated when the SCAN key is depressed.

U.S. Pat. No. 5,414,426, issued May 9, 1995, is incorporated herein by reference. The '426 patent discloses an entry program for enabling a user to define a macro for selecting at least one favorite channel, whereby rapid selection of at least one favorite channel is made upon subsequent depression of a MACRO key.

A drawback of the prior art is that programming a remote control, for example to create a favorite channel list, can be tedious. Accordingly, it would be useful if there were a "short cut" way to indicate to the remote control that the channel currently being viewed should be added to the list. This would allow the user to build a favorite channel list by simply pressing a key, labeled for example "Thumbs Up", whenever the user came across a channel he liked. Likewise, a "Thumbs Down" key could be used to delete a channel that fell out of favor.

A challenge in implementing this feature is that the remote control generally is not able to precisely track which channel number is currently being viewed. On many TV sets, for example, action of the CH+ and CH− keys does not necessarily advance channel numbers in exact numerical order. Also, the effect of holding one of these keys for a longer period is not predictable.

The tuning device (cable or satellite STB, TV set, etc.) does however always know the current channel number. So if a low cost method could be devised to transmit this information back to the remote control on the receipt of a "Thumbs Up" key press, such a feature could be implemented in the remote control.

Transmission of data together with television signals are known and include, for example: Vertical Blanking Interval (VBI), e.g., Teletext and Closed Captioning, FM broadcast radio sub-carrier, and cellular telephone-like data systems. Such systems have been complex and not readily available to most TV viewers.

U.S. Pat. No. 5,594,493, which issued Jan. 14, 1997, and is incorporated herein by reference, discloses transmitting data information along with any standard TV video signal for reception by a "smart card" held near the screen. The smart card includes circuitry, a LCD display screen and a plurality of buttons for interacting with the user. The '493 system utilizes a signal with the data imbedded in the video signal. Thus, video and data signals are received simultaneously and with equal clarity. The '493 patent teaches sending data transmission along with a standard television signal in the form of changing light pulses; the data signal is invisible to the user. The light modulation is then sensed by a photoelectric pickup device within the smart card where it is captured and stored. The data can then be displayed and read at a terminal at a redemption center, for example.

U.S. Pat. No. 5,410,326, which issued Apr. 25, 1995, and is incorporated herein by reference, discloses a universal remote control having a touch screen, capable of displaying icons, and a opto-photo signal detector. When advertising indicia is imbedded in a video signal being displayed on a television receiver, the opto-photo signal detector will detect the encoded video signal and supply a digital data stream to an analog signature and signal processor. The variations in luminance are decoded to provide the corresponding serial data stream to the microprocessor.

Both the '493 and '326 patents comprise overlaying or merging the data stream with the video signal. Also, the data stream is always on—the remote "looks up" and receives the data stream via light transmissions. The video system does not respond to queries from the remote control to, for example, provide its current state.

The following U.S. patent applications disclose methods for controlling media systems and for capturing state information. U.S. patent Ser. No. 09/718,931, filed Nov. 21, 2000, and U.S. patent Ser. No. 09/418,091, filed Oct. 14, 1999, are incorporated herein by reference. The '931 application discloses a media return system with return to state capability. The status of the system is quickly captured and provides a simple means to reset the system to, for example, the state prior to channel surfing. The '091 application discloses a media system with punch-through capability. Functional control may be locked across devices to control a particular device while operating in a different device mode.

This document teaches two-way communication methods differing from those disclosed in the '326 and '493 patents. Particular embodiments complement the various media systems and methods disclosed in the '931 and '091 patent applications.

SUMMARY OF THE INVENTION

This document describes a method for a two-way communications link between a set-top box hooked up to a television or the like (hereafter referred to as "video system"), which can transmit information back to a remote control (also referred to as "receiver"). This facilitates transmitting the current setting of the video system to the remote control using existing hardware (with added software) on the video system side.

Infrared (IR) is used by the remote control to communicate/control the video system and visible light is used by the video system to communicate its status to the remote control.

This system will facilitate the design of user friendly remote control units, which can be programmed to gather user preferences/settings from the video system and use this information for a variety of control scenarios, enhancing the functionality of the remote control.

An object is to provide a method of communicating information to a remote control using existing hardware in set top boxes.

Another object is to provide a method for imparting status information of a particular media parameter to a controlling device. A specific application is directed toward indicating the current channel to the remote control.

Other objects and advantages will be apparent to those of skill in the art from the teachings disclosed herein.

BRIEF DESCRIPTION OF THE DRAWINGS

In the interest of enabling one of skill in the art to practice the invention, exemplary embodiments are shown and described. For clarity, details apparent to those of skill in the art and reproducible without undue experimentation are generally omitted from the drawings and description.

DESCRIPTION OF EXEMPLARY EMBODIMENTS

Figure 1:
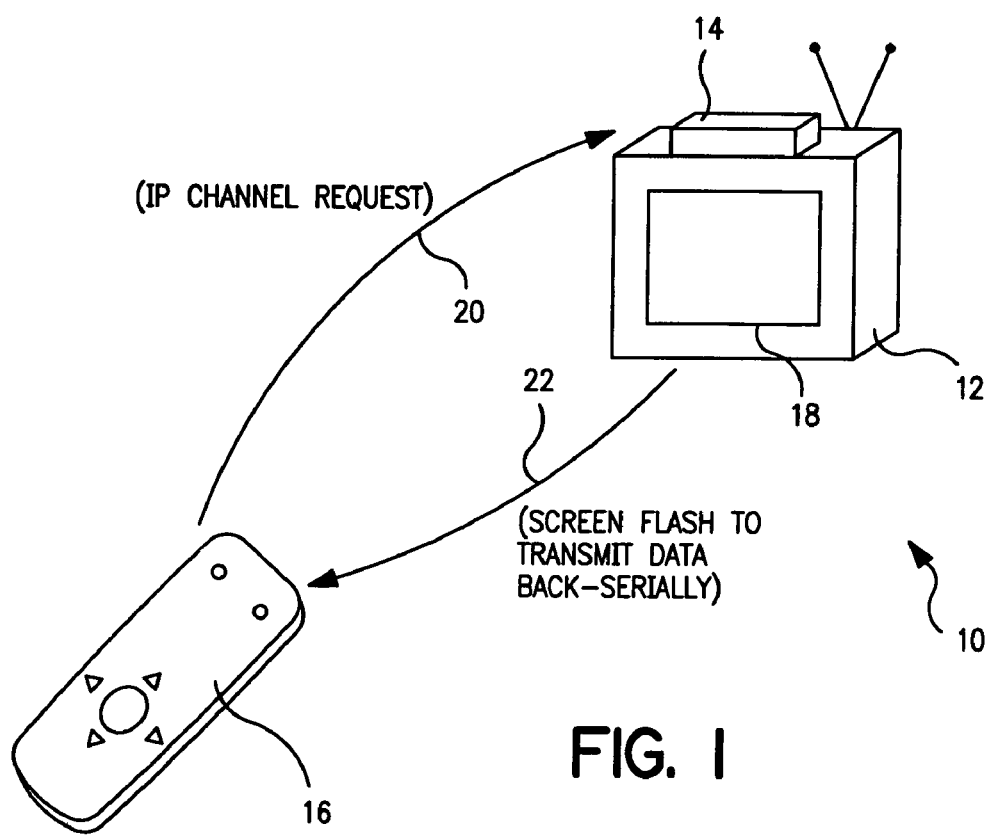
FIG. 1 depicts a block diagram of a media system and process for requesting information from the video system.

This disclosure is discussed in relation to remote controls, however, other uses will be apparent from the teachings disclosed herein. It will be better understood from the following detailed description of exemplary embodiments with reference to the attached drawings, wherein like reference numerals and characters refer to like parts, and by reference to the following claims.

FIG. 1 depicts a typical modern video system 10. The video system comprises a video monitor (display or monitor) 12 that is typically a television and a set top box 14 for receiving an encrypted signal and providing a video signal to the video monitor. A remote control 16 typically controls channel selection and other parameters of the system.

Most modern video systems already have the facility to produce colored screens. Typically this facility is used to blank out a picture (e.g., display a blue screen) during the absence of a video signal.

The video system's screen 18 can be flashed in order to transmit its status. A bright screen could be considered a digital '1' and a dark screen could be considered a digital '0'. In this way a serial data stream can be produced at a low baud rate, organized into ASCII characters for the transmission of text like information.

A receiver in the remote control 16 preferably comprises a circuit optimized to receive flashing visible light, and thereby receive serial information. The remote control 16 also comprises a microprocessor or circuit capable of decoding the serial information and processing it.

In such a system, the steps for conveying information to the remote control may comprise:

1. Request information 20 from the video system 10 using an infrared remote control 16 (The requested information, in a preferred embodiment, is the identification of the current channel);

2. The video system processes the request 20 and transmits the answer 22 in a signal; and 3. The remote control 16 receives the signal 22 and decodes it.

For added reliability a fourth step can be added in which the remote control 16 can re-transmit the received information to the video system 10. In response, the video system 10 can transmit an OK signal (i.e., the remote control 16 received the correct information) or a BAD signal (i.e., the remote control 16 did not receive/process/etc. the correct information) to the remote control 16.

The above method is an exemplary method for implementing two way communications using existing hardware on the video system 10. The method preferably uses existing well defined serial protocol. Such methods allow the current state of video system 10 to be shared with other devices not physically attached to it.

Figure 2:
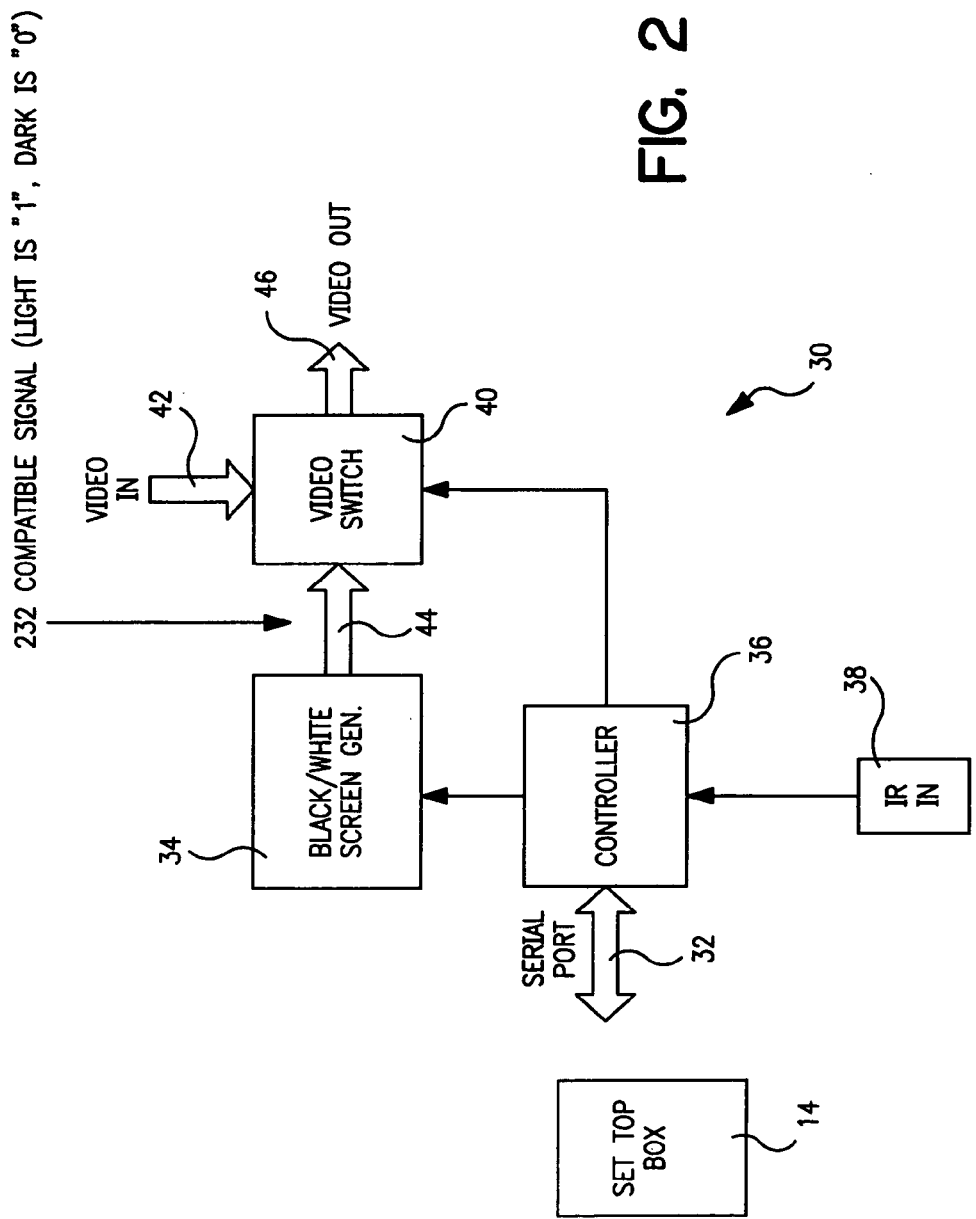
FIG. 2 depicts a flow chart diagram of an exemplary method for transmitting data from the video system.

FIG. 2 is a block diagram of a transmitter 30 which may be used to cause the video monitor 18 to flash in response to a request 20. For clarity this transmitter 30 is shown separate from and connected to the set top box 14 via a serial port 32. It will be appreciated however that most set top boxes already include a screen generator 34 for generating, for example, black and white screens, a controller 36, such as a microprocessor, an IR input port 38 for receiving control commands from, for example, a remote control 16, and video switching capability (provided via, for example, video switch 40) to switch the output signal 46 between a video-in signal 42 and a (light-dark) screen generator signal 44. Since the transmitter 30 components are typically within existing set top boxes as described above, in many cases the appropriate software can be downloaded to the set top box by any number of conventional processes and no additional hardware is required.

Figure 3:
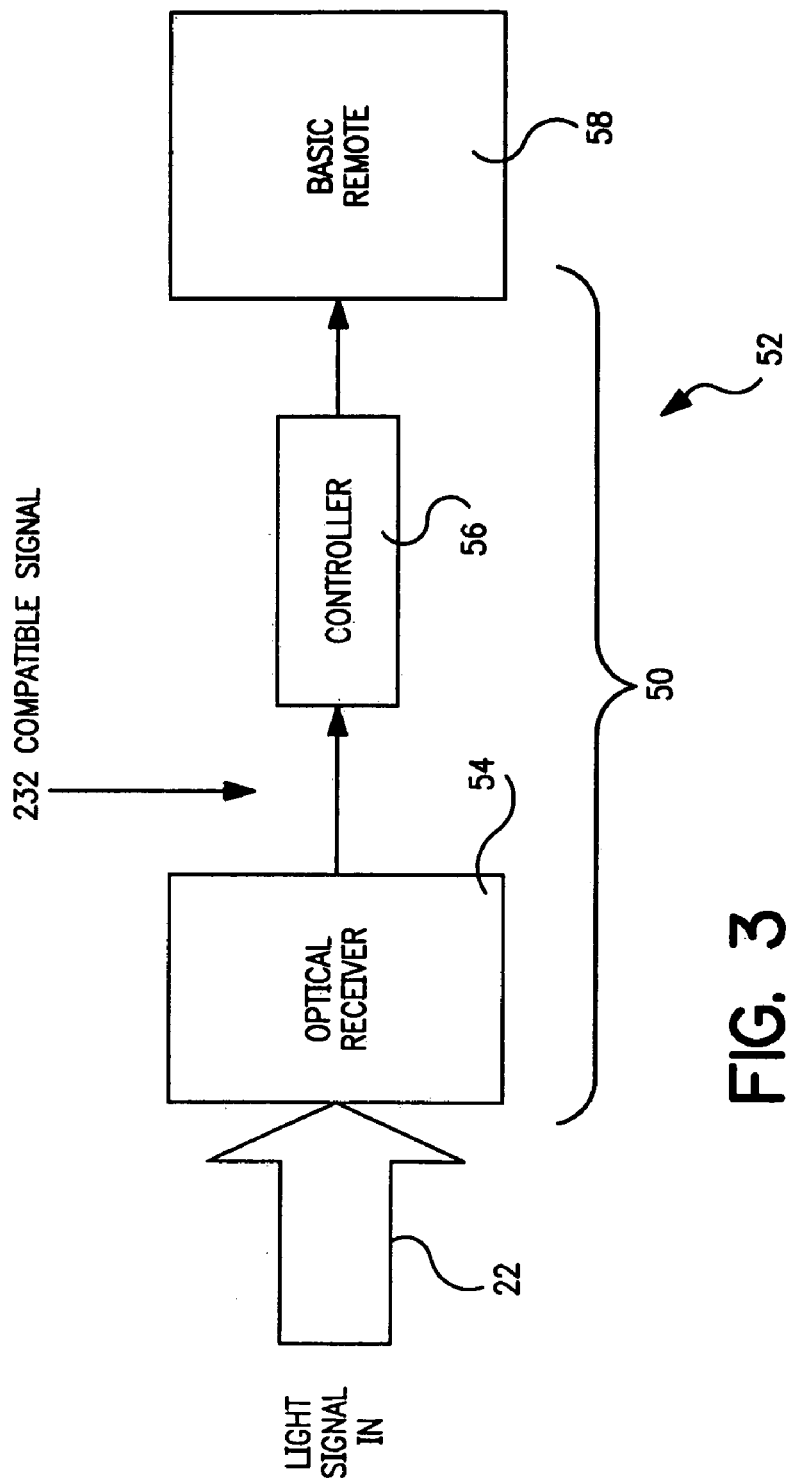
FIG. 3 depicts a flow chart diagram of an exemplary method for receiving data from the video system.

A receiving section 50 of a remote control 52 compatible with the teachings in this document is shown in FIG. 3. The receiving section 50 comprises an optical receiver 54 for receiving visible light and a controller 56 for decoding the light received. The conventional functions of the remote control are indicated by block 58.

The diagrams of FIGS. 2 and 3 are only examples. Each block can be implemented as a stand-alone function or within other functional blocks. In particular, most or all of the functions shown in FIG. 2 may be implemented within the set top box 14 if so desired. The figures are discussed in more detail below:

FIG. 2 illustrates in functional block form, elements for transmitting data from the video system 10 using the method described below. Other methods are also acceptable. The steps conforming to FIG. 2 comprise:

1. A request to transmit data is input via the IR receiver;
2. The system processes this request and develops a response;
3. The existing video signal is interrupted using a switching means and is connected to a screen generator; and
4. The generator flashes the screen in accordance with the pre-established serial protocol and baud rate effectively transmitting the response using visible light (e.g., White=Logical '1' and Black=Logical '0').

FIG. 3 illustrates in functional block form elements for receiving data from the video system 10 using the method described below. Other methods are acceptable.

In addition to the existing infrared transmitter, e.g. the basic remote control 58, an optical, visual light, receiver 54 is utilized which can transform the light signal to electrical signals. These signals are then sent to a microprocessor 56 for decoding. The microprocessor 56 could be the existing processor in the remote control or an additional one that is linked to the remote control's processor.

The transmitter 30 of the information to the remote control 16 performs the functions as outlined in FIG. 2. A microprocessor 36 from Microchip's PIC family was chosen because it is inexpensive and has the speed to perform signal generation. Example algorithms for using this processor to implement serial communications and black-and-white video signal generation are readily available on the Internet and from other sources. It will however be appreciated that other equally suitable microprocessors are also available. In order to generate an NTSC compatible signal a minimum of three discrete voltage states are utilized. With a simple microprocessor algorithm up to four states can be accomplished using a voltage divider attached to two microprocessor I/O ports by selectively connecting either port to system power or ground. With accurate timing from a crystal controlled microprocessor clock oscillator, a simple NTSC black and white signal can thus be generated. A detailed exposition of one such software algorithm may be found, for example, at http://www.efd.lth.se/~e96rg/mc/video/rtvideo.htm and, for the sake of brevity, no further description will be provided herein.

Figure 4:
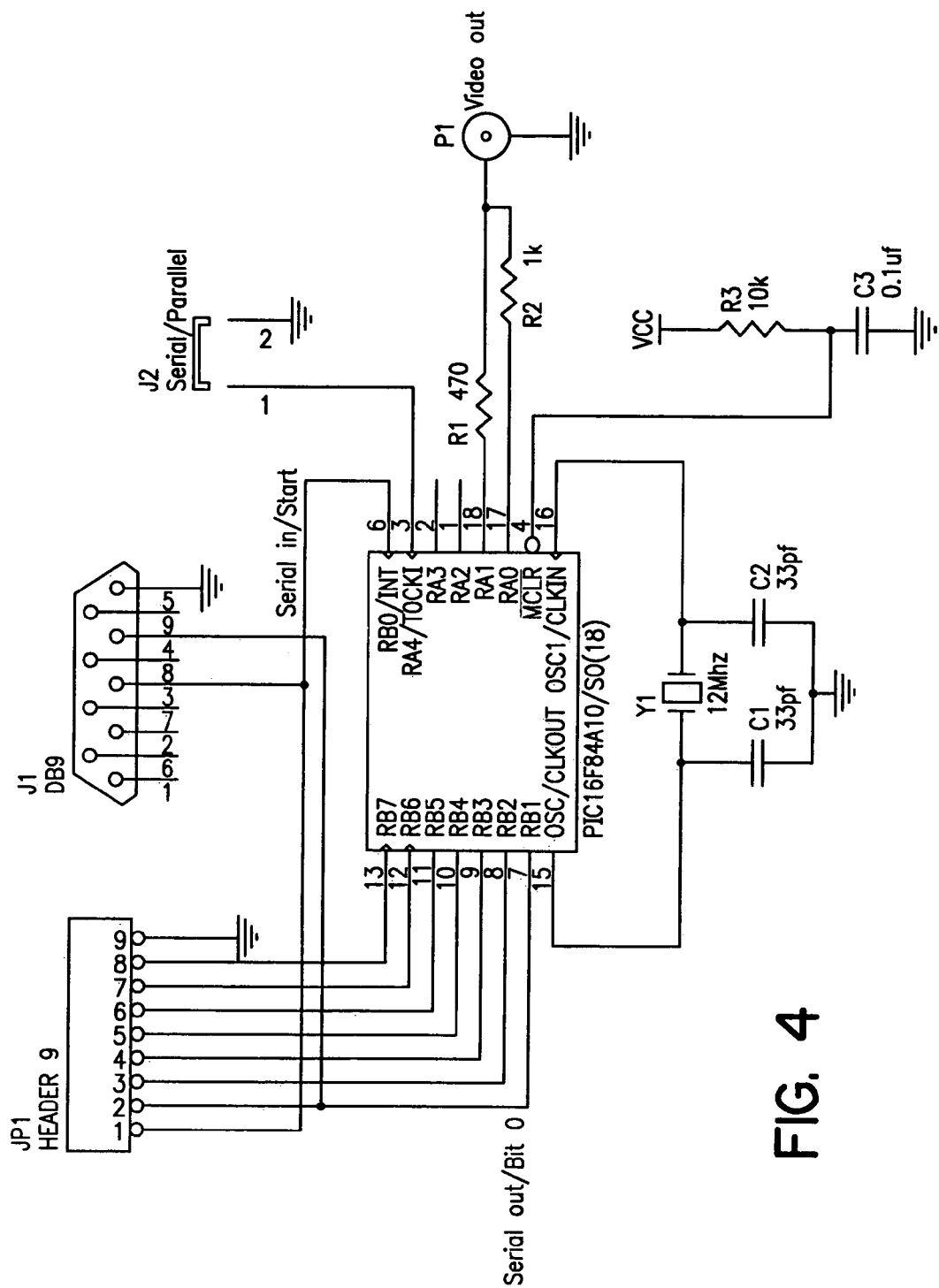
FIG. 4 depicts a schematic diagram of an exemplary system for producing a signal. For clarity, the video switch and IR receiver are not shown.

FIG. 4 is an exemplary schematic of a circuit to implement the control and signal generation portions (34,36,44) of the transmitter 30 shown in FIG. 2. The video switch 40 and IR receiver 38 are not included for clarity. Both the IR receiver 38 and video switch 40 are connected via JP1, while serial communication 32 to the set top box 14 is via J1. JP2 is used if needed to set user preferences on start up (for example, PAL versus NTSC video signaling). Resistors R1 and R2 connected to microprocessor U1's I/O ports RA0 and RA1, in conjunction with the 75-ohm impedance of the video output cable connected to P1, form the voltage divider described above.

Figure 5:
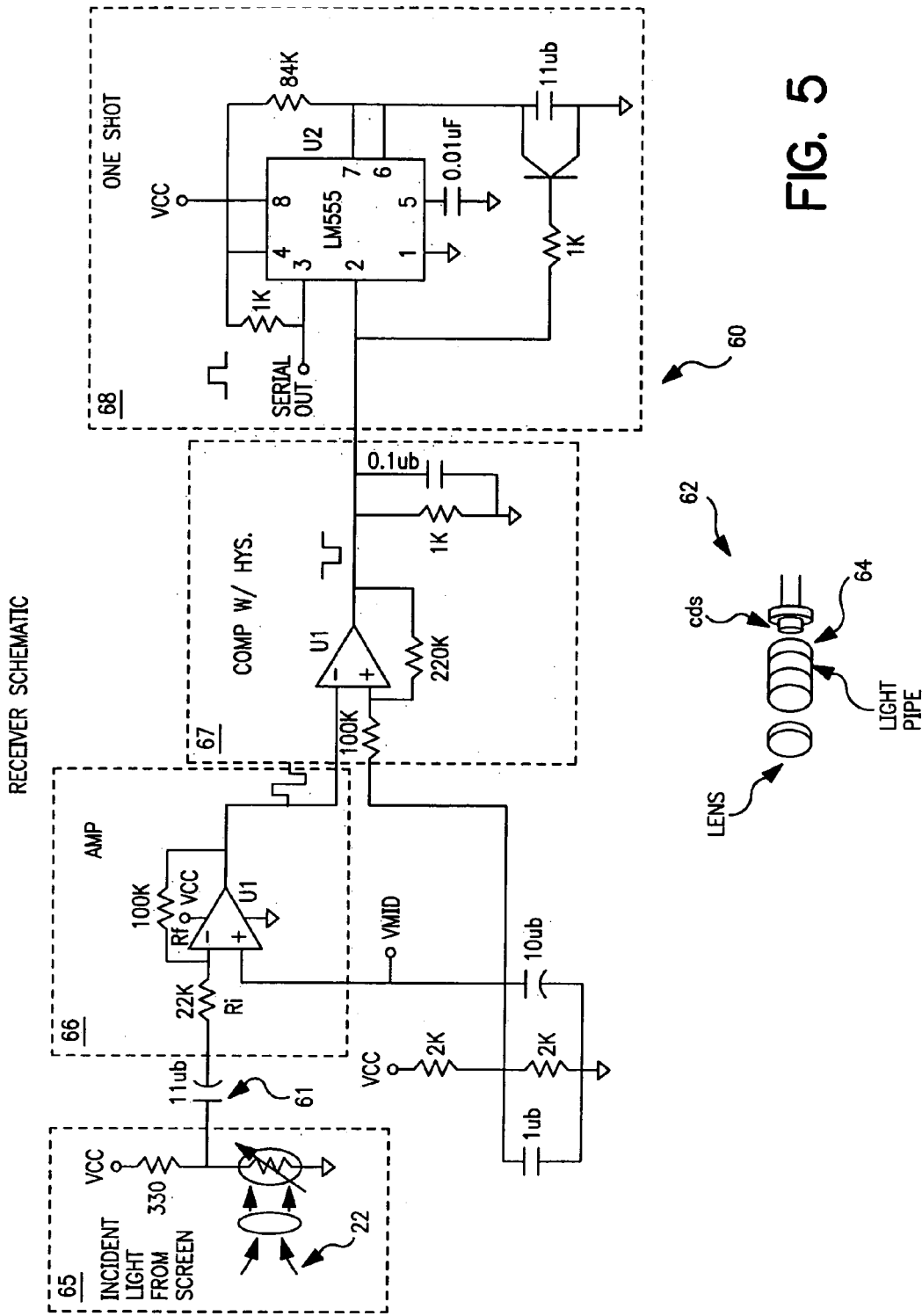
FIG. 5 depicts a schematic diagram of an exemplary system for transforming the received optical signal to an electrical signal that can be interfaced to a microprocessor.

FIG. 5 illustrates an exemplary circuit 60 for use in the receiver 52 to transform the received optical signal 22 to an electrical signal which can be interfaced to a processor. This is by no means the only way to do this. There are four stages in circuit 60 shown in FIG. 5. They are:

1. CdS Cell/Voltage Divider 65;
2. Amplifier 66;
3. Comparator with hysteresis 67; and
4. One shot 68.

CdS Cell/Voltage Divider

Since the receiver 52 will typically be some distance from the transmitter 30, a means to concentrate the optical signal 22 onto the transducer is preferred. The optical signal 22 can thus be focused on the CdS (Cadmium Sulfide) transducer cell 62 using a lens and light pipe 64 to minimize interference from stray light. The CdS cell changes resistance as light strikes it and forms one leg of a voltage divider circuit. As light hits the cell 62, its resistance changes and the ratio of the divider is changed causing a voltage shift at the junction of the divider. Since the signal coming from the video source is transitory this signal is AC coupled 61 to the amplification stage.

Amplifier

This stage and the comparator stage get their references from the same source as the divider (Vcc or power supply). This makes the entire circuit ratiometric and less susceptible to power supply variation. The amplifier 66 is configured to be an AC amplifier whose DC output is ½ Vcc. The AC gain can be set by varying the ratio of Rf to Ri as shown in FIG. 5. The signal is next coupled to a comparator.

Comparator with Hysteresis

The comparator 67 compares the signal from the amplifier against a known reference and produces a logical '1' or '0'. For reliability, some small amount of positive feedback should be incorporated to snap the output signal and keep it from oscillating at the transition point.

One Shot

The signal is then fed to a one shot timer 68 to process out any 50 or 60 Hz scanning artifacts in the signal that may be present in some Cathode Ray Tube (CRT) monitor screens (item 18). The one shot feature could be implemented either in hardware as shown or in software using the remote control's microprocessor. Following this stage, the signal is sent to the microprocessor for processing as described below.

Figure 6:
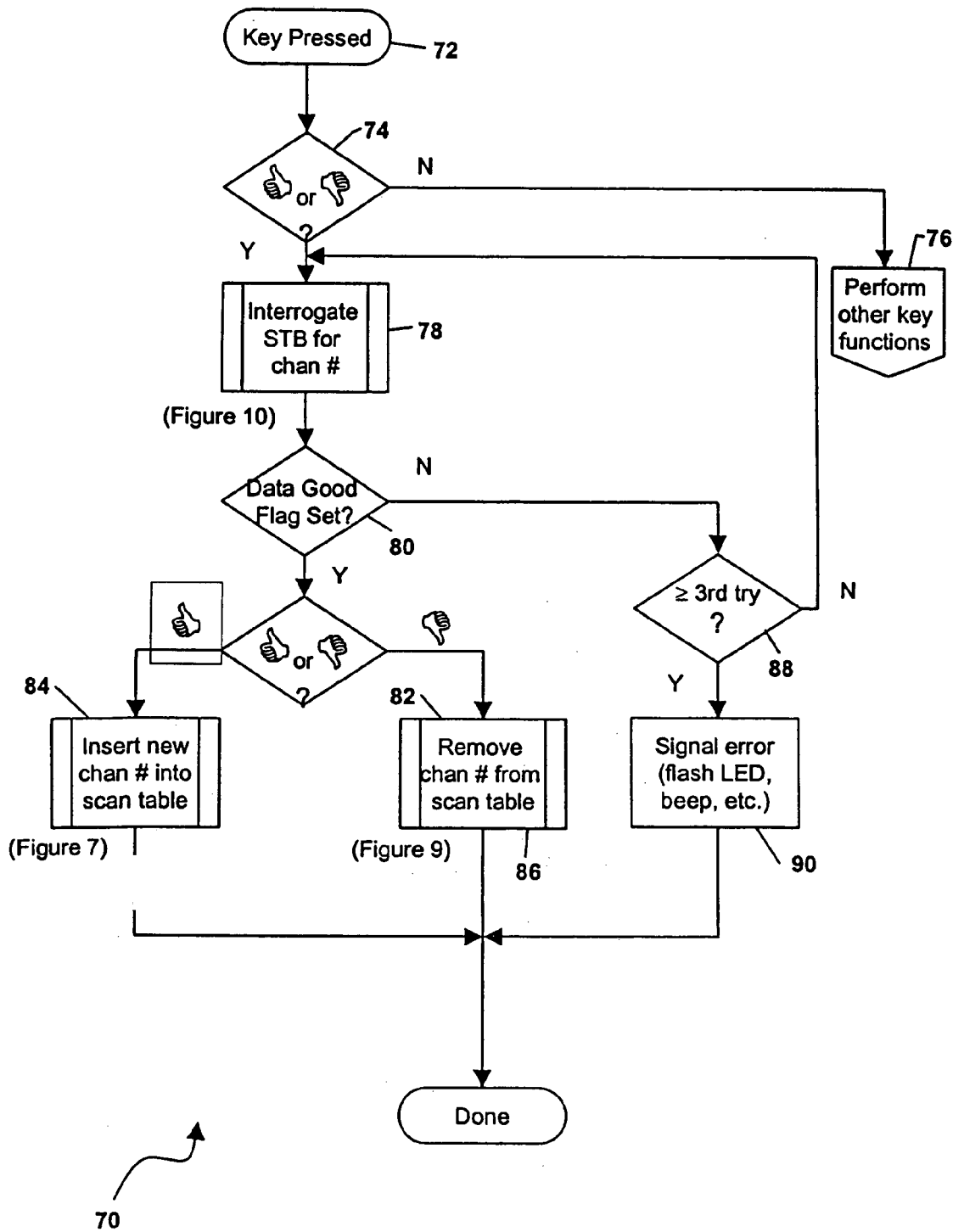
FIG. 6 depicts a flow chart diagram of an exemplary method for modifying a favorite channel scan table.

FIG. 6 is a logic flow diagram 70 for modifying a channel scan table. In response to a key selection, the remote control 16 determines if the key selected is the "add-a-channel" key or the "remove-a-channel" key. Steps 72–74. The "add-a-channel" and "remove-a-channel" keys are respectively represented by thumbs-up and thumbs-down icons. If the key selected is not a channel table modification key, the functions associated with the selected key are performed in a normal manner. Step 76. If the user has indicated a desire to modify the channel table (by selecting one of the thumbs-up/down icons), the remote control 16 will interrogate the STB via IR channel request 20 as illustrated in FIG. 10. Step 78. If the data received from the STB is good, then the identified channel will be added, in accordance with FIG. 7, or deleted, in accordance with FIG. 9, depending on which thumbs-up/down icon was selected. Steps 80–86. If the data is bad, the remote control will request the channel identification again, for a predetermined number of time. Steps 80 and 88–90.

Figure 7:
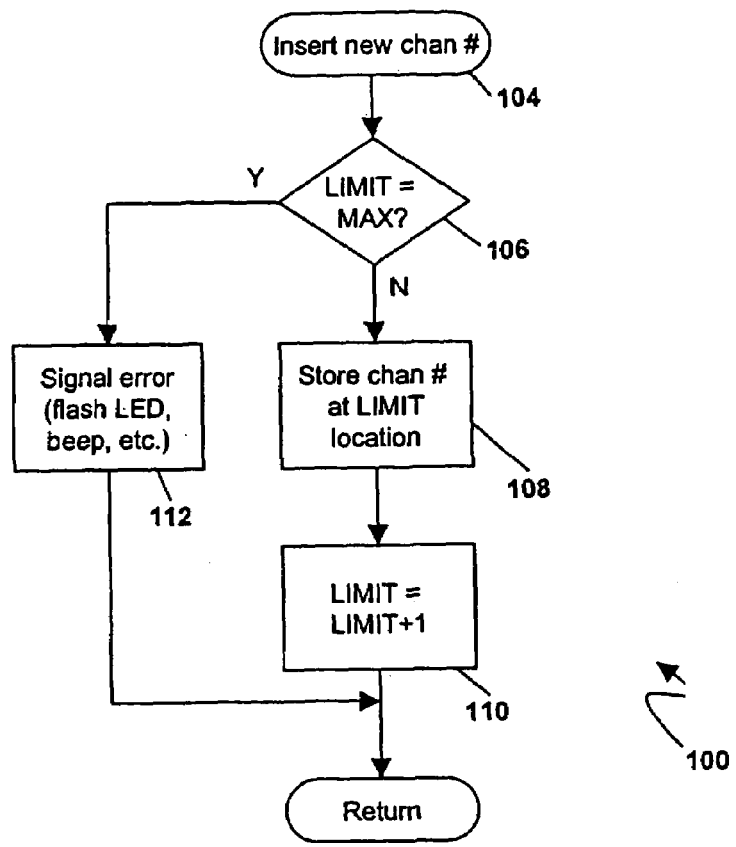
FIG. 7 depicts a flow chart diagram of an exemplary method for inserting a channel into a channel scan table.
Figure 8:
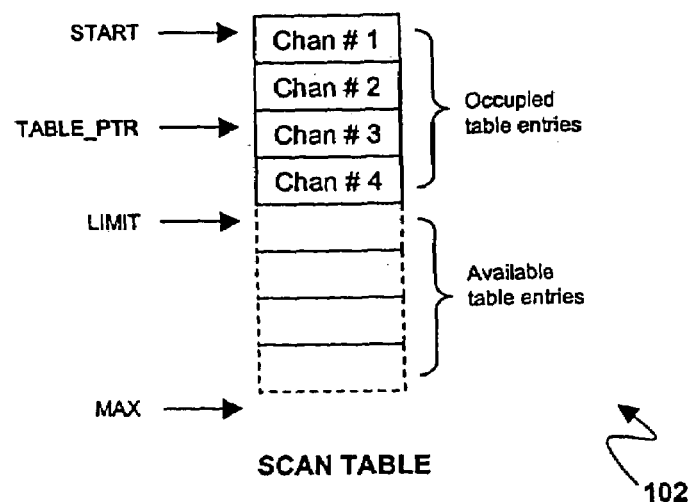
FIG. 8 depicts a representative channel scan table.

FIG. 7 is a logic flow diagram 100 for inserting a channel into the scan table 102 depicted in FIG. 8. If the table has not reached its maximum limit, the channel identifier is stored in the table and the LIMIT counter is advanced by one. Steps 104–110. If the table is full, the user will be notified, for example by an error message or flashing lights, that the table is full and the new channel cannot be added. Step 112.

Figure 9:
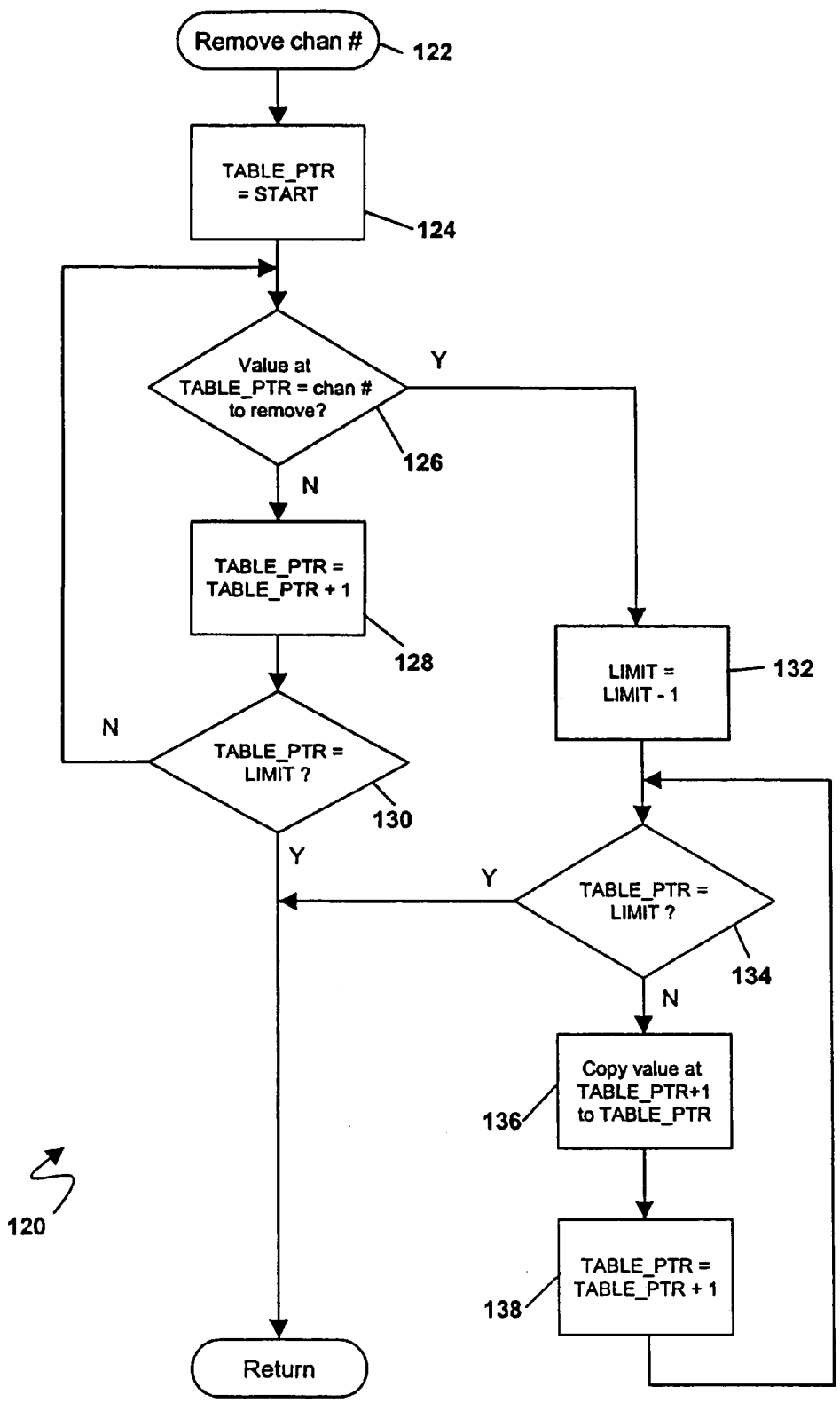
FIG. 9 depicts a flow chart diagram of an exemplary method for removing a channel from a channel scan table.
Figure 10:
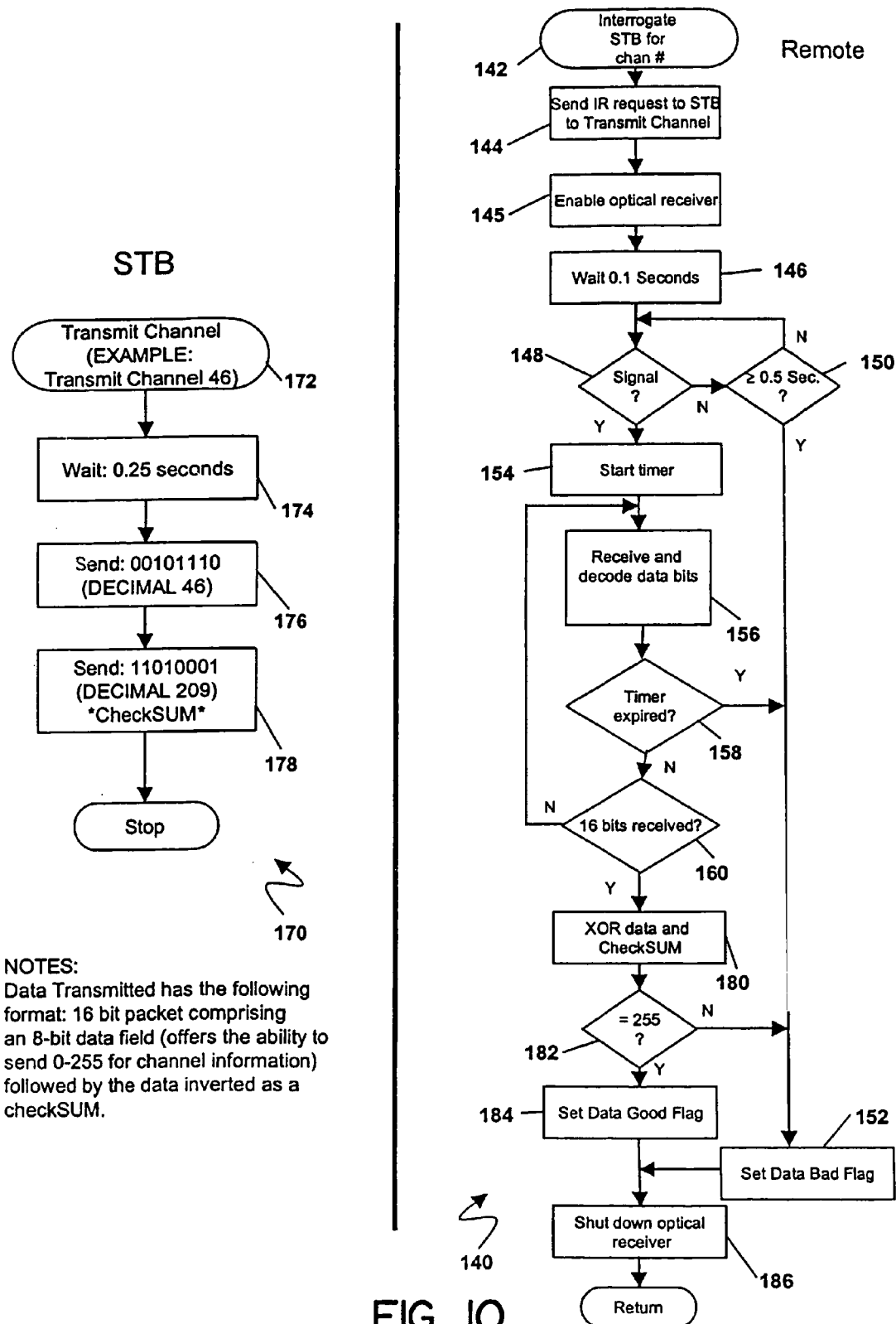
FIG. 10 depicts a logic flow diagram for interrogating a set top box (STB) within the system.

FIG. 9 is a logic flow diagram 120 for deleting a channel from scan table 102. The table pointer TABLE_PTR is moved through the table 102, typically stepwise, until the value stored in the table is equal to the value of the channel identified by the STB 14 via optical signal 22. Steps 122–130. The table limit, i.e., the number of channels in the table, should be reduced. If the channel to be deleted is located at the table limit, then reducing the table limit at that point has the effect of removing the channel-to-be-removed from the table. Steps 132–134. If the channel-to-be-removed is not at the table limit, then the values of each successive cell is copied into each preceding cell. In effect the channels above the channel-to-be-removed each take a step down in the table, thereby pushing the channel-to-be-removed out of the table and reducing the limit of the table. Steps 134–138.

For more details on modifying a scan table, refer to U.S. Pat. No. 5,481,256 issued Jan. 2, 1996, which is incorporated herein by reference.

FIG. 10 shows logic flow diagrams 140 and 170 for interrogating STB 14 and transmitting channel data (via optical signal 22) to remote control 16. The remote control 16 sends IR channel request 20 to STB 14, enables the optical receiver 50 and then waits a predetermined time to receive and decode 16 bits of channel identification data. Steps 142–160. If 16 bits of data are not received within the predetermined time interval, the receiver logic 140 sets a "Bad Data" status flag (for use at step 80, FIG. 6) and then exits after shutting down the optical receiver. Steps 150 and 152.

After the STB 14 receives channel request 20, it sends, in binary serial form via optical signal 22, the channel identification data. Then a checksum is sent. Steps 172–178. After the data has been received by the remote 16, a checksum validity test is performed to determine if the data received is valid and a status flag set accordingly (for processing at step 80, FIG. 2) and the optical receiver is shut down. Steps 180–186.

While aspects of the invention has been particularly shown and described with reference to particular embodiments thereof, it will be understood by those skilled in the art that various changes in form and detail may be made therein without departing from the spirit and scope of the invention. The scope of the claimed invention is intended to be defined by following claims as they would be understood by one of ordinary skill in the art with appropriate reference to the specification, including the drawings, as warranted.

The invention claimed is:

1. A media system comprising:
   a video screen;
   a screen generator connected to the video screen which determines a channel that is currently being displayed on the video screen and which causes the video screen to flash to convey via a predetermined serial protocol channel identification information that functions to specify the channel that was determined to be currently being displayed on the video screen; and
   a remote control comprising:
      a memory having a favorite channel table;
      an optical receiver connected to receive the video screen flashes and convert them to an electrical signal;
      a controller connected to the optical receiver for decoding the electrical signal to thereby store in the favorite channel table of the memory the channel identification information; and
      programming response to actuation of a favorite channel key which retrieves from the favorite channel table of the memory the channel identification information and which uses the channel identification information to cause a transmission of a command adapted to tune an appliance to the channel corresponding to the channel identification information.

2. The media system of claim 1, wherein the video screen is operably connected to flash light and dark screens.

3. The media system of claim 1, wherein the screen generator causes the video screen to flash in response to a transmission received from the remote control.

* * * * *

UNITED STATES PATENT AND TRADEMARK OFFICE
CERTIFICATE OF CORRECTION

| | |
|---|---|
| PATENT NO. | : 7,193,661 B2 |
| APPLICATION NO. | : 09/967069 |
| DATED | : March 20, 2007 |
| INVENTOR(S) | : Mauro Dresti, Patrick H. Hayes and Youping (Edward) Yun |

Page 1 of 1

It is certified that error appears in the above-identified patent and that said Letters Patent is hereby corrected as shown below:

Column 8, line 35, claim 1: the word "response" should be replaced with the word --responsive--

Signed and Sealed this

Sixth Day of November, 2007

JON W. DUDAS
*Director of the United States Patent and Trademark Office*